United States Patent
Kasuya et al.

[11] Patent Number: 5,917,246
[45] Date of Patent: Jun. 29, 1999

[54] SEMICONDUCTOR PACKAGE WITH POCKET FOR SEALING MATERIAL

[75] Inventors: Hirokazu Kasuya; Kouji Numazaki, both of Nukata-gun; Takahisa Koyasu, Chita; Mitsuhiro Saitou, Obu, all of Japan

[73] Assignee: Nippondenso Co., Ltd., Japan

[21] Appl. No.: 08/620,580

[22] Filed: Mar. 22, 1996

[30] Foreign Application Priority Data

Mar. 23, 1995 [JP] Japan ................................. 7-064286

[51] Int. Cl.⁶ ................................................ H01L 23/29
[52] U.S. Cl. .......................................... 257/790; 257/787
[58] Field of Search .................................. 257/687, 790, 257/791, 787, 788

[56] References Cited

U.S. PATENT DOCUMENTS

| | | | |
|---|---|---|---|
| H73 | 6/1986 | Claasen et al. .......................... | 257/791 |
| 3,427,510 | 2/1969 | Schwarz .................................. | 257/687 |
| 3,484,536 | 12/1969 | Jaeschke et al. ........................ | 257/687 |
| 3,504,132 | 3/1970 | Wallace, Jr. ............................. | 257/687 |
| 3,654,695 | 4/1972 | Del Gaudio ............................. | 257/687 |
| 4,339,768 | 7/1982 | Keller et al. ............................. | 257/687 |
| 4,801,998 | 1/1989 | Okuaki .................................... | 257/687 |
| 4,812,897 | 3/1989 | Narita et al. ............................. | 257/687 |
| 4,849,803 | 7/1989 | Yamamoto et al. ..................... | 257/687 |
| 5,243,223 | 9/1993 | Yamada et al. .......................... | 257/791 |
| 5,349,240 | 9/1994 | Narita et al. ............................. | 257/791 |
| 5,386,342 | 1/1995 | Rostoker ................................. | 257/790 |
| 5,483,217 | 1/1996 | Nagasaka et al. . | |
| 5,539,253 | 7/1996 | Nagaune ................................. | 257/706 |

FOREIGN PATENT DOCUMENTS

| | | |
|---|---|---|
| 62-39036 | 2/1987 | Japan . |
| 63-73944 | 5/1988 | Japan . |
| 63-110044 | 7/1988 | Japan . |
| 6-1226 | 1/1994 | Japan . |

Primary Examiner—Olik Chaudhuri
Assistant Examiner—Nathan K. Kelley
Attorney, Agent, or Firm—Pillsbury Madison & Sutro, LLP

[57] ABSTRACT

A semiconductor package, which secures the protection of circuit elements from the external environment, is disclosed. A single in-line package (SIP) is constructed by fixingly sealing a hybrid integrated circuit component within a casing with epoxy resin. A sleeve is bonded on the surface of a ceramic substrate. The sleeve is formed with silicon rubber into a pocket shape so as to cover respective circuit elements of the hybrid integrated circuit component. In the sleeve is made an opening part. Silicon gel is poured into the sleeve as a fixingly sealing material and cured to seal the respective circuit elements. Terminals downwardly extends in parallel with each other from an end part of the ceramic substrate through an opening part of the casing.

30 Claims, 14 Drawing Sheets

SEMICONDUCTOR PACKAGE WITH POCKET FOR SEALING MATERIAL

CROSS REFERENCE TO RELATED APPLICATION

This application is based upon and claims the benefit of priority of the prior Japanese Patent Application No. 7-64286 filed on Mar. 23, 1995, the contents of which are incorporated herein by reference.

BACKGROUND OF THE INVENTION

1. Field of the Invention

The present invention generally relates to a semiconductor package and a method for manufacturing the same. More particularly, the present invention relates to a semiconductor package such as a single in-line package (SIP) or dual in-line package (DIP).

2. Related Arts

Conventionally, as semiconductor packages, there has been an SIP illustrated in FIGS. 26 and 27, for example, in which a hybrid integrated circuit component S is fixed and sealed within a casing 1 with epoxy resin 2.

In the hybrid integrated circuit component S, a semiconductor chip 4 and bonding pads 5 mounted on the surface of a ceramic substrate 3 are connected with respective bonding wires 6. On the surface of the ceramic substrate 3 is bonded an annular rampart-shaped sleeve 7. This sleeve 7 walls the semiconductor chip 4, the respective bonding wires 6 and the respective bonding pads 5 from the outer circumference.

The semiconductor chip 4, the respective bonding wires 6 and the respective bonding pads 5 are fixedly sealed with silicon gel 8 inside the sleeve 7 (FIG. 27). In FIGS. 26 and 27, the reference numeral 9 denotes terminals extending from an end part of the ceramic substrate 3.

In manufacturing the SIP as described above, the present inventors conducted the sealing work as follows: as illustrated in FIG. 28, the ceramic substrate 3 is held with the opening part of the sleeve 7 upwardly facing; the silicon gel 8 is poured onto a region walled by the sleeve 7 with a dispenser 8a; the poured silicon gel 8 is then thermally cured; the resultant ceramic substrate 3, i.e., the hybrid integrated circuit component S, is inserted into the casing 1; the epoxy resin 2 is poured into the casing 1; and then the epoxy resin 2 is thermally set.

However, as it takes extra labor and time to manually perform these steps, there has been a request for automation by using robot hands or the like.

SUMMARY OF THE INVENTION

In making these manual operations go automatic, as the pouring of the silicon gel 8 into the sleeve 7 and the pouring of the epoxy resin 2 into the casing 1 should be performed by holding the respective terminals 9 up above the ceramic substrate 3 to prevent the adherence of the silicon gel 8 and the epoxy resin 2 to the respective terminals 9.

In this position, as the sleeve 7 is held with the opening part thereof opened to the side, the pouring of the silicon gel 8 into the sleeve 7 must be laterally performed. However, if the pouring of the silicon gel 8 is laterally performed, the silicon gel 8 poured into the sleeve 7 will flow out of the sleeve 7.

As a result, the sleeve 7 will not be filled with the silicon gel 8, and the semiconductor chip 4, the respective bonding wires 6 and the respective bonding pads 5 will not fixedly be sealed with the silicon gel 8. Therefore, the sleeve 7 of such structure will not be suitable to the automatic manufacture of the semiconductor package, which poses a problem.

In view of the above novel problem, the present invention has an object to provide a semiconductor package which is suitable to the automatic manufacture by improving the sleeve structure for fixingly sealing the circuit elements mounted on the substrate, including the semiconductor element and the bonding wires, and manufacturing methods for such semiconductor package.

In order to fulfill the above object, a semiconductor package according to the present invention comprises a circuit substrate, circuit elements mounted on the circuit substrate including a semiconductor element and a bonding wire, a casing for housing the circuit substrate together with the circuit elements, a cover member mounted on the circuit substrate to cover the circuit elements and having an opening part opening to the direction along the circuit substrate, a first filling material made of an insulating resin for fixingly sealing the circuit elements by being poured into the cover member through the opening part thereof, and a second filling material made of an insulating resin for sealing the circuit substrate by being poured into the casing through an opening part thereof.

Here, silicon gel may be selected as the first filling material, and epoxy resin may be selected as the second filling material.

The cover member may be formed into a pocket shape having the opening part opening to the direction along the circuit substrate.

The opening part of the cover member may also be formed narrower in width than the cover member.

Furthermore, to increase the area of the opening part of the pocket, a notch part may be provided in the wall of the cover member located in opposition to the circuit substrate.

In a manufacturing method for a semiconductor package according to the present invention, the semiconductor package being constructed with a circuit substrate and circuit elements mounted on the circuit substrate including semiconductor element and bonding wires, which are housed all together within a casing, and terminals extend from an end part of the circuit substrate through an opening of the casing, the manufacturing method comprises the steps of providing a pocket shape cover member on the circuit substrate so as to cover the circuit elements and also be open at the opening part in the direction of the extension of the terminals, fixingly sealing the circuit elements by pouring silicon gel into the cover member through the opening part thereof while holding the cover member with the opening part thereof upwardly opened and lowering the circuit elements into the silicon gel and then setting the silicon gel, inserting the circuit substrate into the casing through the opening thereof by holding the terminals upwardly positioned, and fixingly sealing the cover member and the silicon gel within the cover member by pouring the epoxy resin into the casing through the opening thereof while holding the terminals upwardly extended from the opening of the casing and then setting the epoxy resin.

According to the present invention, the cover member is provided on the circuit substrate so as to cover the circuit elements and the opening part thereof is opened in the direction along the circuit substrate, and the first filling material fills the inside of the cover member fixingly sealing the circuit elements and the second filling material fills the inside of the casing fixingly sealing the circuit substrate and the cover member.

Therefore, while the opening part of the cover member is being held upwardly faced, the filling of the inside of the cover member with the first filling material, the insertion of the circuit substrate and cover member into the casing, and the filling of the inside of the casing with the second filling material can be achieved. As a result, by constructing the cover member as described above, the semiconductor package suitable to automatic manufacture can be provided.

Specifically, as the pocket shaped cover member is structurally opened in the direction of the extension of the terminals, the pouring of the silicon gel into the cover member, the insertion of the circuit substrate into the casing, and the pouring of the epoxy resin into the casing can be achieved while the opening part of the cover member is being upwardly faced. Therefore, these pour operations can easily be automated. As a result, the automatic manufacture of the semiconductor package of this type is possible.

In this case, as the terminals are always positioned above the cover member, there is no possibility that the silicon gel and the epoxy resin adhere to the terminals in the above pouring processes.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

The first embodiment according to the present invention will now be described referring to the appended drawings.

Figure 1:
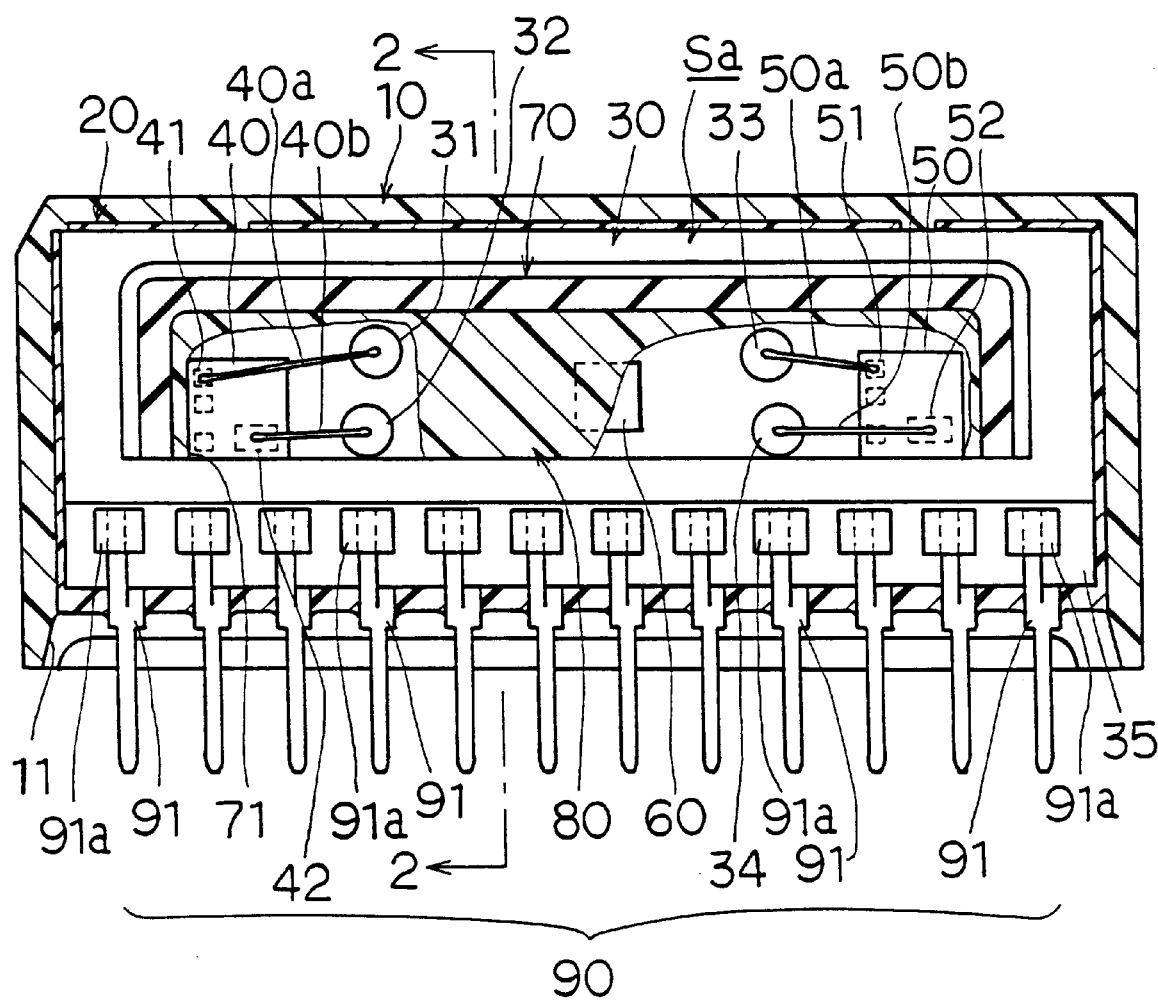
FIG. 1 is a sectional view taken along line 1—1 of FIG. 2 and shows a front view of a semiconductor package according to a first embodiment of the present invention.
Figure 2:
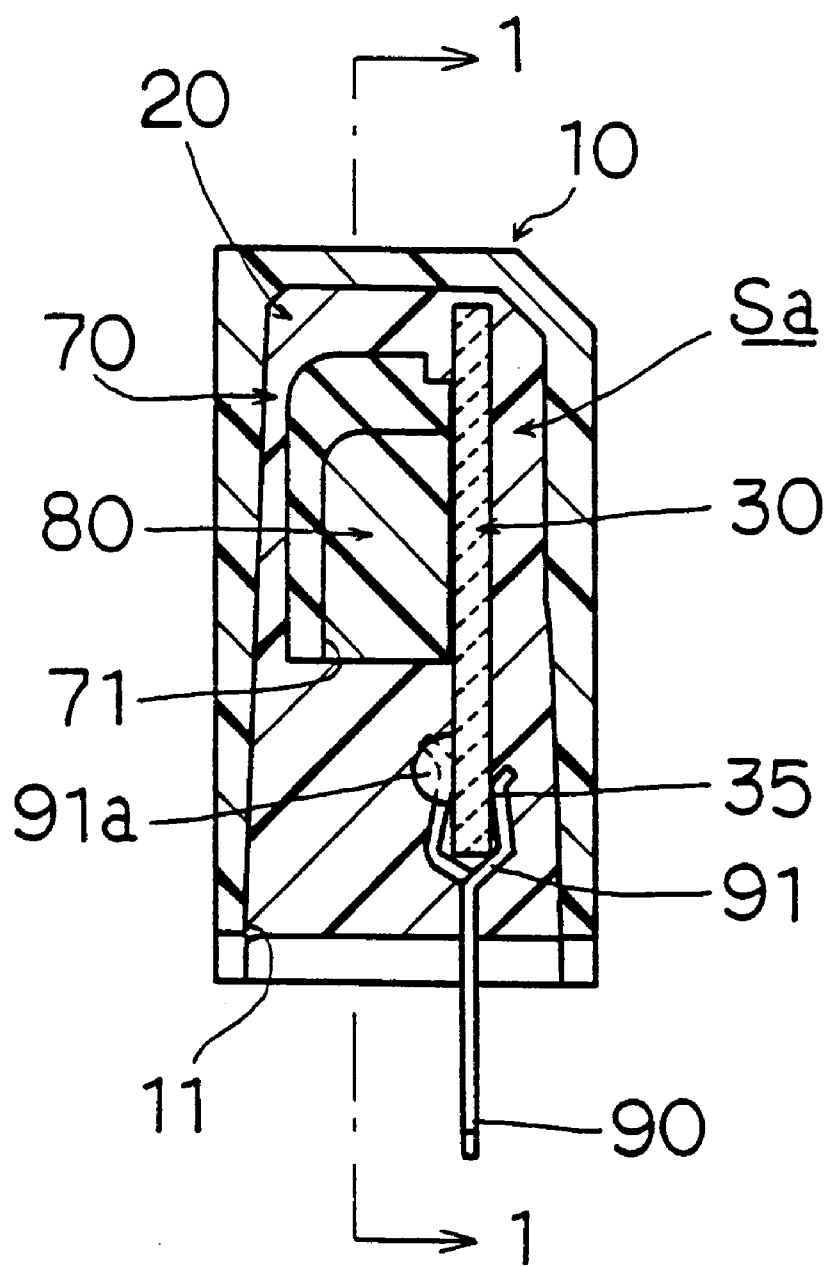
FIG. 2 is a sectional view taken along line 2—2 of FIG. 1 and shows a side view of the embodied semiconductor package.

FIGS. 1 and 2 illustrate a semiconductor package according to a first embodiment of the present invention. In the construction of this semiconductor package, a hybrid integrated circuit component Sa is fixedly sealed within a rectangular parallelepipedic casing 10 with epoxy resin 20. As a semiconductor package, single in-line package (SIP) is employed in this embodiment.

The hybrid integrated circuit component Sa has a ceramic substrate 30. On both left and right sides of the surface of the ceramic substrate 30 are mounted D-MOS type semiconductor chips 40 and 50 respectively.

The semiconductor chip 40 is connected by the wire bonding method with bonding pads 31 and 32 formed on the surface of the ceramic substrate 30 in the vicinity of the semiconductor chip 40 with bonding wires 40a and 40b at electrodes 41 and 42 respectively.

On the other hand, the semiconductor chip 50 is connected by the wire bonding method with bonding pads 33 and 34 formed on the surface of the ceramic substrate 30 in the vicinity of the semiconductor chip 50 with bonding wires 50a and 50b at electrodes 51 and 52 respectively. In FIG. 1, the reference numeral 60 denotes a monolithic integrated circuit (MIC) mounted on the central part of the surface of the ceramic substrate 30.

A sleeve (equivalent to a cover member) 70 is bonded on the surface of the ceramic substrate 30. The sleeve 70 is formed into a pocket shape with silicon rubber so as to enclose from the outer circumference side the respective semiconductor chips 40 and 50, the respective bonding wires 40a, 40b, 50a and 50b and the respective bonding pads 31 through 34, which are circuit elements, as illustrated in FIG. 1, and cover these circuit elements from the top thereof as understood from FIG. 2. The sleeve 70 has an opening part 71 downwardly (viewed in FIG. 1) opened.

Within the sleeve 70 is thermally set a silicon gel 80 poured thereinto as a sealing material to fixingly seal the circuit elements described above.

A plurality of terminals 90 are connected to an end part 35 of the ceramic substrate 30 positioned on the side of the opening part 71 of the sleeve 70. The respective terminals 90 downwardly (viewed in FIG. 1) extend in parallel with each other from the end part 35 of the ceramic substrate 30 through an opening part 11 of the casing 10. The connection of each terminal 90 to the end part 35 of the ceramic substrate 30 is achieved by clipping the end part 35 of the ceramic substrate 30 with end clip parts 91 of the respective terminals 90 and then applying respective solderings 91a to the respective clipped parts.

Next, an automatic manufacturing method for the semiconductor package constructed as described above will be described referring to FIGS. 3 through 13.

Figure 3:
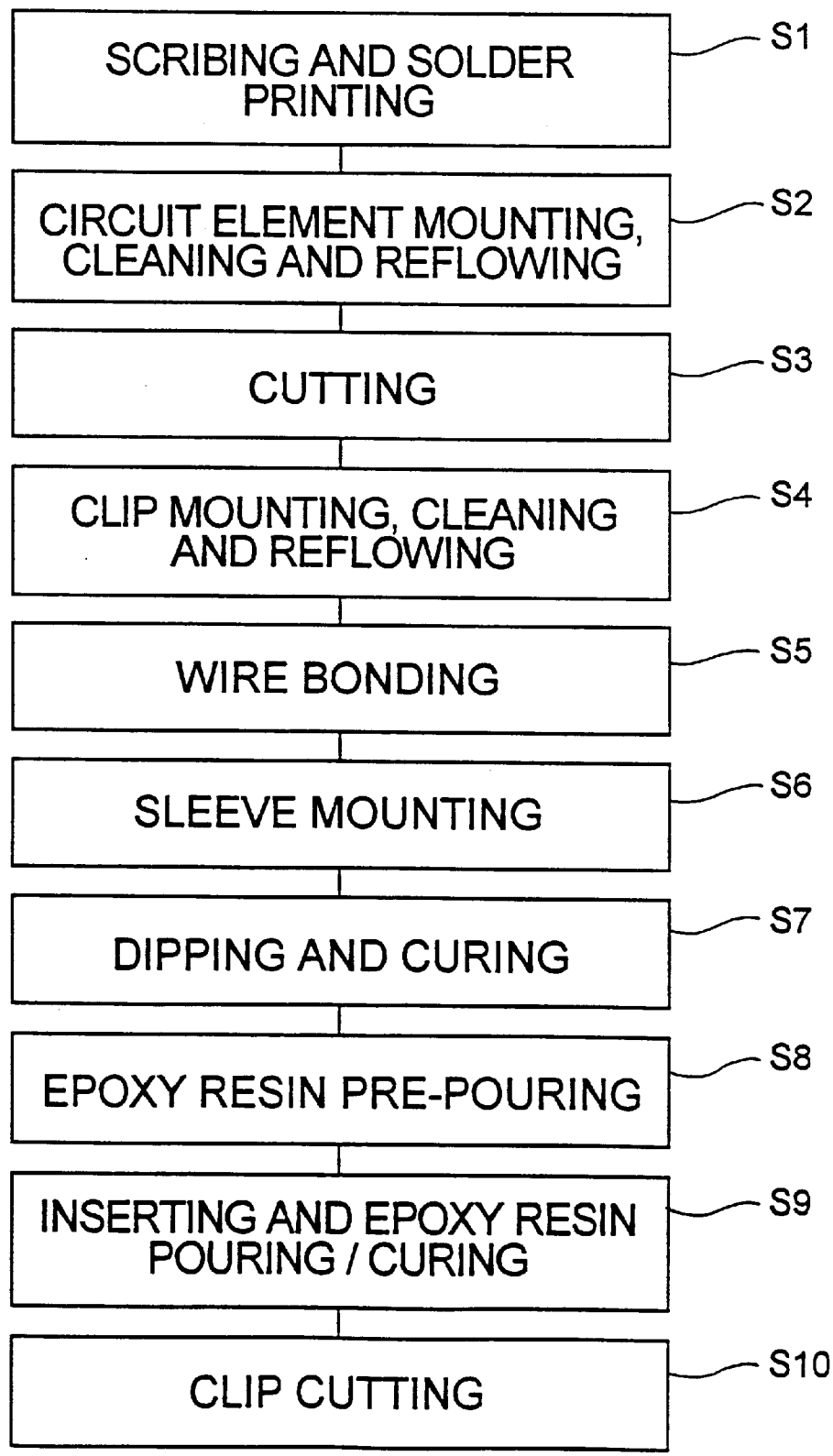
FIG. 3 is a process flow chart for the manufacture of the semiconductor package of FIG. 1.
Figure 4:
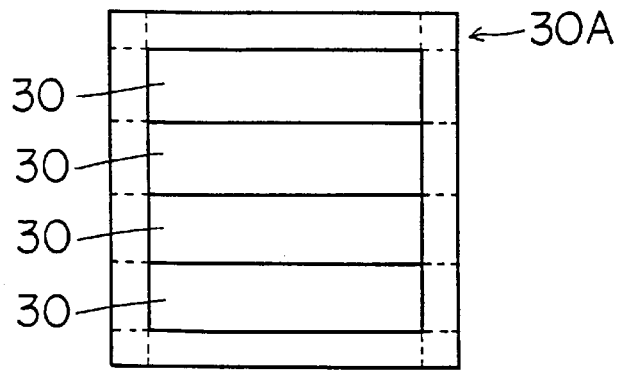
FIG. 4 is a plan view illustrating a state in which a multiple ceramic substrate has been scribed in the scribing and solder printing process of FIG. 3.

Firstly, in the scribing and solder printing process S1 of FIG. 3, as indicated in FIG. 4 by the broken line and the solid line, the scribing processing for scribing a multiple ceramic substrate 30A with laser beams in preparation for separating the same into each ceramic substrate 30. Then, the solder printing process is applied to a plurality of desired locations (locations where the circuit element are to be mounted) on the portions equivalent to both left and right side parts (viewed in FIG. 4) of the surface of each ceramic substrate 30 of the multiple ceramic substrate 30A by using a screen printing system.

Figure 5:
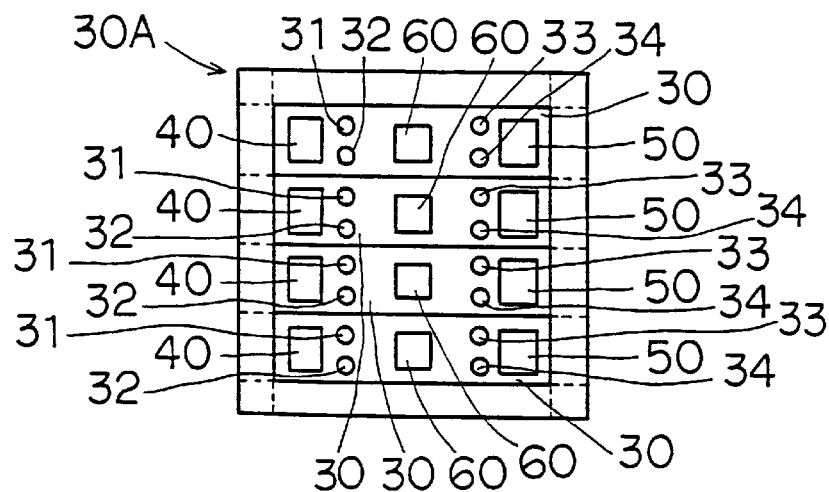
FIG. 5 is a plan view illustrating a state in which the multiple ceramic substrate has been mounted with each circuit element in the circuit element mounting, cleaning and reflowing process of FIG. 3.

Then, in the circuit element mounting, cleaning and reflowing process S2, as illustrated in FIG. 5, the respective semiconductor chips 40 and 50, the MIC 60 and the respective bonding pads 31, 32, 33 and 34 are temporarily mounted on the solder printed parts described above. After this, the temporarily mounted multiple ceramic substrate 30A is cleaned and passed through a reflowing furnace to melt and harden the solder printed parts.

Figure 6:
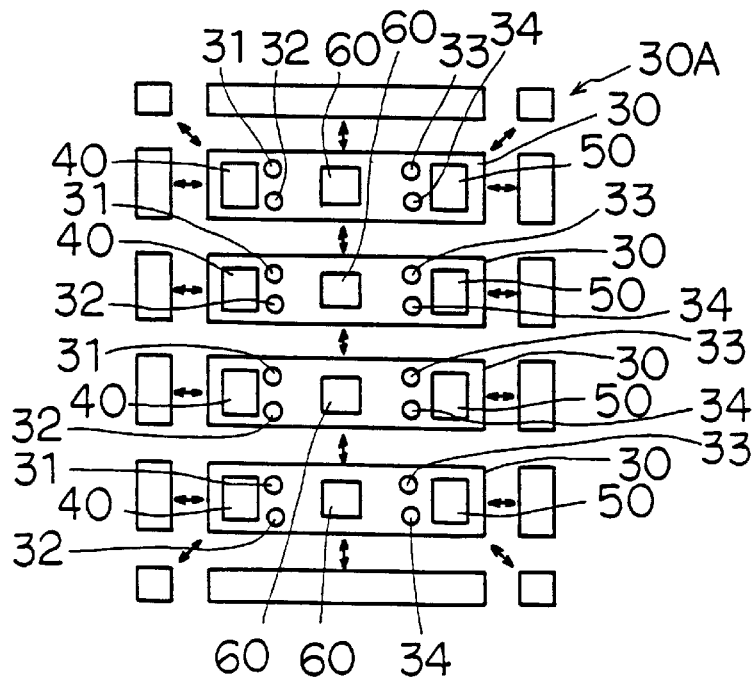
FIG. 6 is a plan view illustrating a state in which the multiple ceramic substrate has been separated in the cutting process of FIG. 3.

Following these processings, in the cutting process S3, as illustrated in FIG. 6, the multiple ceramic substrate 30A is separated along the scribing lines into each ceramic substrate 30.

Figure 7:
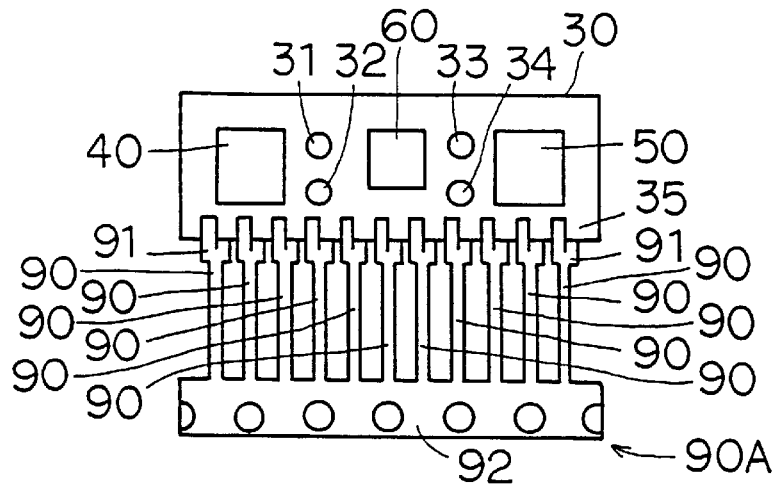
FIG. 7 is a plan view illustrating a state in which a ceramic substrate has been mounted with clips in the clip mounting, cleaning and reflowing process of FIG. 3.

Next, in the clip mounting, cleaning and reflowing process S4, as illustrated in FIG. 7, a clip 90A is mounted to the end part 35 of each ceramic substrate 30 separated as described above. In this case, as illustrated in this figure, the clip 90A is formed by integrally extending the respective terminals (leads) 90 from a connection part (a tie bar) 92. The mounting of the respective terminals 90 to the end part 35 of each ceramic substrate 30 is achieved by clipping the end part 35 of the ceramic substrate 30 with the respective end clip parts 91 of the respective terminals 90 and then by applying the respective solderings 91a to the respective clipped parts. Generally in this case, a plurality of ceramic substrates 30 are clipped to one connection part 92. Of course, it is possible that the connection part 92 whose length has been adjusted to the width of each ceramic substrate 30 is prepared for a plurality number and each ceramic substrate 30 is clipped in correspondence with each connection part 92.

Then, each ceramic substrate 30 in the clip mounted state as described above is passed through the reflowing furnace. After the soldered parts of the clipped parts are melted and hardened, and the ceramic substrates 30 are cleaned. Then, in case a plurality of substrates 30 are suspended with respect to a single connection part 92, the connection part 92 is cut off to make the ceramic substrates 30 individual.

Figure 8:
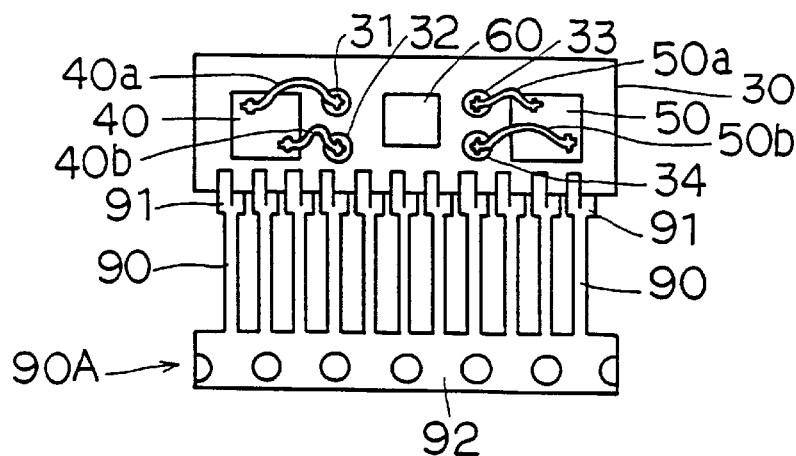
FIG. 8 is a plan view illustrating a state in which the ceramic substrate has been mounted with respective bonding wires in the wire bonding process of FIG. 3.

Subsequently, in the wire bonding process S5, as illustrated in FIG. 8, the respective electrodes 41 and 42 of the semiconductor chip 40 of each ceramic substrate 30 are connected by the wire bonding method with the respective bonding pads 31 and 32 with the respective bonding wires 40a and 40b, and also, the respective electrodes 51 and 52 of the semiconductor chip 50 of each ceramic substrate 30 are connected by the wire bonding method with the respective bonding pads 33 and 34 with the respective bonding wires 50a and 50b.

Figure 9:
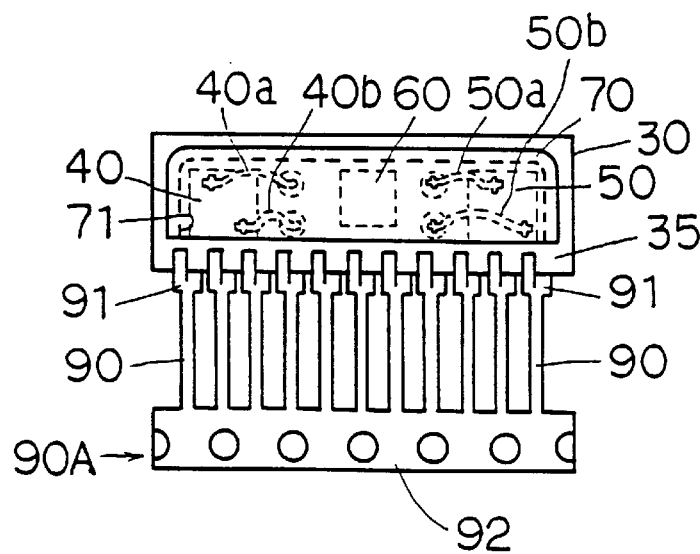
FIG. 9 is a plan view illustrating a state in which the ceramic substrate has been bonded with a sleeve in the sleeve mounting process of FIG. 3.

In the sleeve mounting process S6, as illustrated in FIG. 9, the sleeve 70 prepared beforehand is bonded to the surface of the ceramic substrate 30. The bonding is achieved by orienting the opening part 71 of the sleeve 70 to the side of the end part 35 of the ceramic substrate 30 and at the same time covering the semiconductor chips 40 and 50, the respective bonding pads 31 through 34, the respective bonding wires 40a, 40b, 50a and 50b and the MIC 60.

Figure 10:
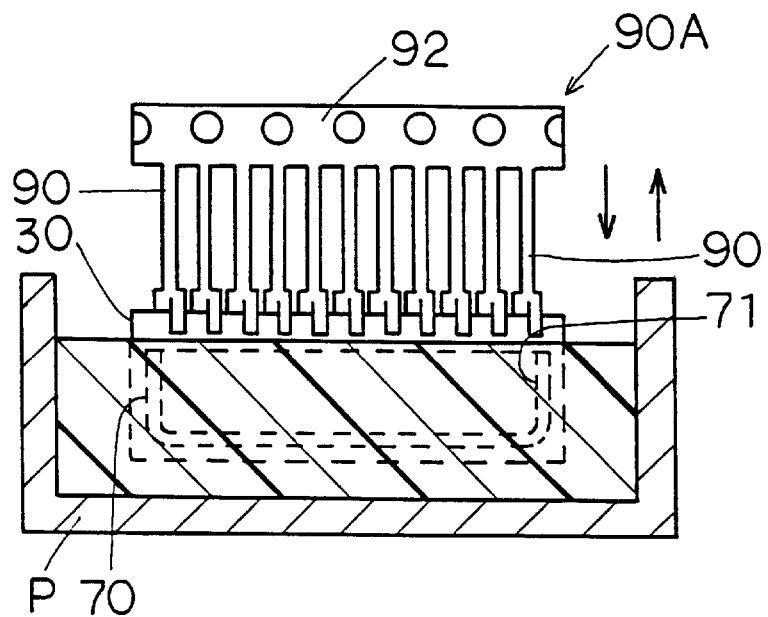
FIG. 10 is a partial sectional view illustrating a state in which the ceramic substrate has been dipped into silicon gel within a dipping tub in the dipping and curing process of FIG. 3.
Figure 11:
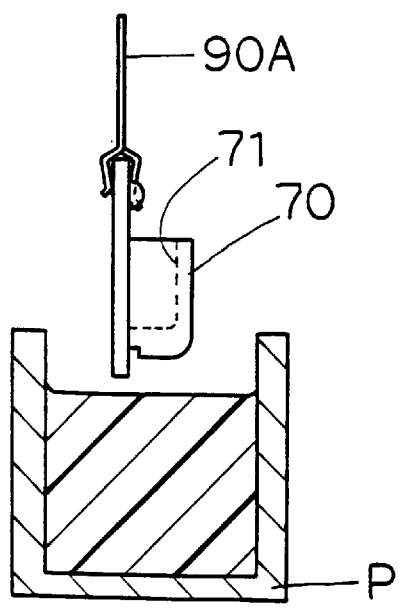
FIG. 11 is a partial sectional view illustrating a state in which the ceramic substrate has been dipped into the silicon gel within the dipping tub in the dipping and curing process of FIG. 3.

In the next dipping and curing process S7, as illustrated in FIGS. 10 and 11, the ceramic substrate 30 is suspended and held right above a dipping tub P by gripping the connection part 92 of the clip 90A by a robot arm. From this position, the clip 90A is lowered by lowering the robot arm, and thereby the ceramic substrate 30 is immersed in the silicon gel within the dipping tub P.

This immersing is continued until the entire sleeve 70 including the opening part 71 thereof completely dipped into the silicon gel. At this time, as the sleeve 70 is pocket shaped and upwardly opened, the air within the sleeve 70 is upwardly pushed by the silicon gel entering the sleeve 70. Therefore, the silicon gel can enter the sleeve 70, leaving no air therein.

When a preset time has elapsed and the silicon gel has completed entered the sleeve 70 and covered all circuit elements within the sleeve 70, the clip 90A is lifted by raising the robot arm and thereby the ceramic substrate 30 is extracted from the silicon gel within the dipping tub P, and concurrently the silicon gel within the sleeve 70 is thermally cured. At this time, even if the air remains within the sleeve 70, this air is exhausted from the opening part 71 of the sleeve 70 when the silicon gel is thermally cured.

In this process, as the clip 90A is always positioned above the silicon gel within the dipping tub P, the silicon gel will not adhere to any of the terminals 90 of the clip 90A.

Figure 12:
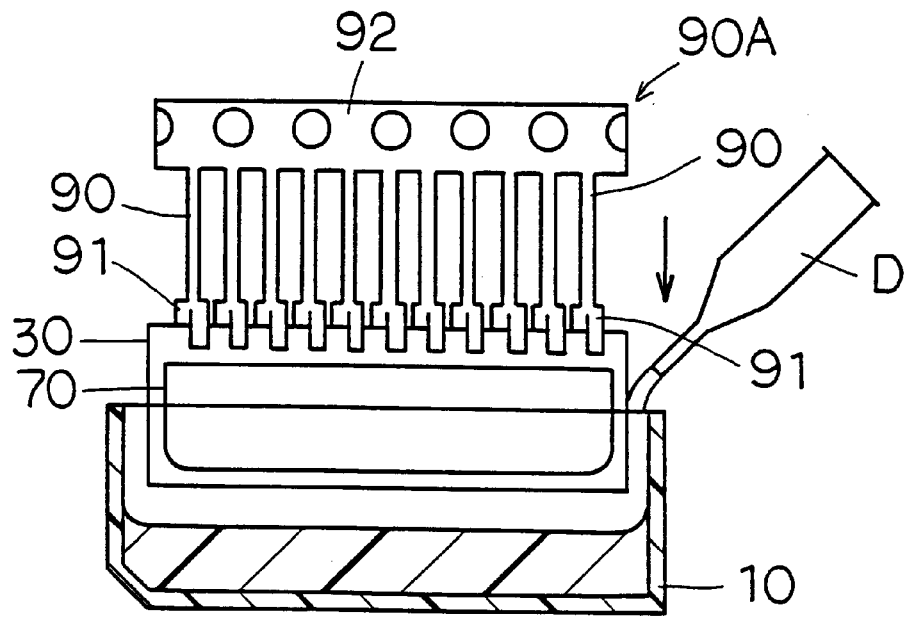
FIG. 12 is a partial sectional view illustrating a state in which a casing is partially poured with epoxy resin and the ceramic substrate is inserted into the casing in the epoxy resin pre-pouring process and the inserting and epoxy resin pouring process of FIG. 3.

After completing the above process, in the epoxy resin pre-pouring process S8, as illustrated in FIG. 12, a preset volume of epoxy resin (approximately a half of the capacity of the casing 10) is poured into the casing 10 prepared beforehand with a dispenser D.

Then, in the inserting and epoxy resin pouring and curing process S9, as illustrated in FIG. 12, the ceramic substrate 30 is suspended and held right above the casing 10 by gripping the connection part 92 of the clip 90A by the robot arm. From this position, the clip 90A is lowered by lowering the robot arm, and thereby the ceramic substrate 30 is inserted into the casing 10. This lowering is continued until the respective clip parts 91 of the respective terminals 90 of the clip 90A enters the casing 10.

At this time, as the sleeve 70 is pocket shaped, the silicon gel can completely fill the inside of the sleeve 70 by automatically pouring the silicon gel into the sleeve 70 as described above. Therefore, the automatic insertion of the ceramic substrate 30 into the casing 10 can easily be achieved without causing the adherence of the epoxy resin to any of the circuit elements within the sleeve 70.

Then, epoxy resin is poured into the casing 10 with the dispenser D until the epoxy resin covers the sleeve 70, the ceramic substrate 30, and the respective clip parts 91 of the respective terminals 90, and then thermally cured. This completes the sealing of the sleeve 70 and each circuit element therewithin with the epoxy resin.

At this time, as the epoxy resin within the casing 10 is completely shut from the respective circuit elements within the sleeve 70 with the silicon gel within the sleeve 70, the respective circuit elements within the sleeve 70 can completely be protected from the thermal stress of the epoxy resin.

Furthermore, as the respective circuit elements within the sleeve 70 are shut from the atmosphere with the silicon gel within the sleeve 70, the epoxy resin within the casing 10 and the casing 10, humidity, etc. in the outside will not invade the circuit elements within the sleeve 70. Therefore, the reliabilities of the circuit elements, including the semiconductor chips 40 and 50 and the bonding wires 40a, 40b, 50a and 50b, can sufficiently be maintained, and the lifetimes thereof can be elongated.

Figure 13:
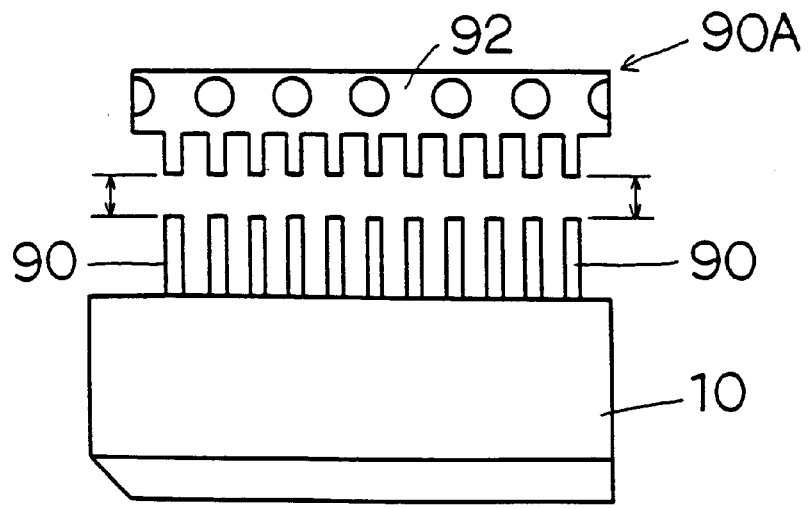
FIG. 13 is a plan view illustrating a state in which a clip connection part has been cut off in the clip cutting process of FIG. 3.

As described above, after the completion of the inserting and epoxy resin pouring and curing process S9, in the clip cutting process S10, as illustrated in FIG. 13, the connection part 92 of the clip 90A is cut off from the respective terminals 90.

With the above processes S1 through S10, the automatic manufacture of a plurality of semiconductor packages can efficiently be completed, and the semiconductor packages of the construction described above suitable to the automation of manufacture can be provided.

Here, as the respective circuit elements are fixedly sealed in multiple with the silicon gel 80, the epoxy resin 20 and the casing 10, the protection of the circuit elements of the semiconductor package of this type from the external environment can be reinforced.

Figure 14:
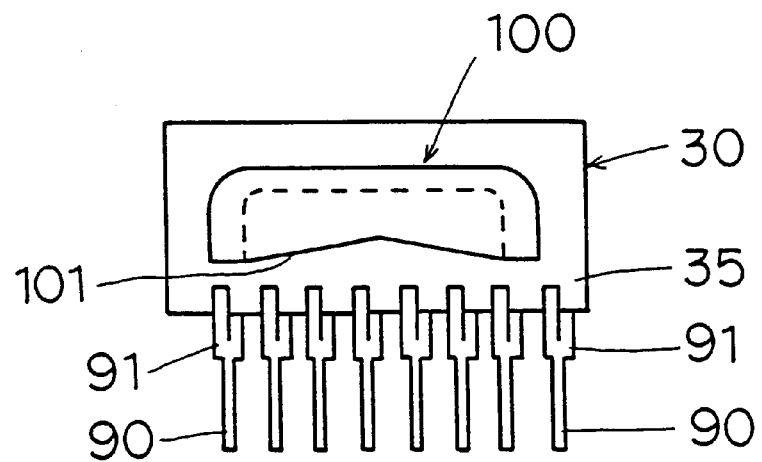
FIG. 14 is a plan view illustrating an important part of a second embodiment according to the present invention.
Figure 15:
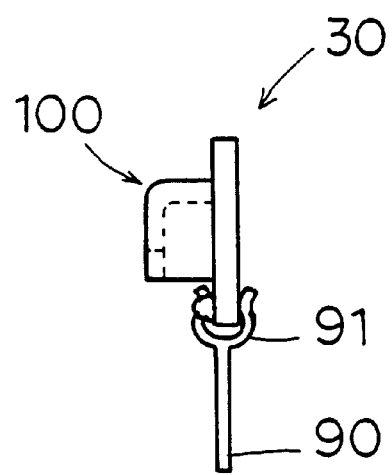
FIG. 15 is a side view illustrating the important part of the second embodiment.

FIGS. 14 and 15 show a second embodiment according to the present invention.

In the second embodiment, instead of the sleeve 70 of the first embodiment, a sleeve 100 is bonded on the surface of the ceramic substrate 30 as a constructional characteristic.

The sleeve 100 has an opening part 101 of V shape (equivalent to the opening part 71 of the sleeve 70).

According to the second embodiment, in the dipping and curing process S7, when the sleeve 100 is immersed in the silicon gel within the dipping tub P (FIGS. 10 and 11) in the same way as the sleeve 70, as the opening part 101 of the sleeve 100 is V shaped, the transfer of the silicon gel into the sleeve 100 begins earlier than the case of sleeve 70.

For this reason, the waiting time required for filling the inside of the sleeve 100 with silicon gel can be shortened. The other construction, mode of operation and effect are the same as those of the first embodiment.

Figure 16:
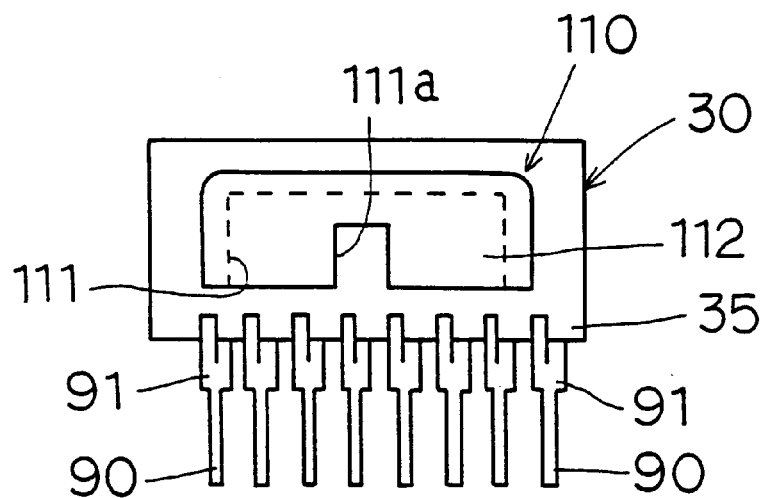
FIG. 16 is a plan view illustrating an important part of a modification to the second embodiment.
Figure 17:
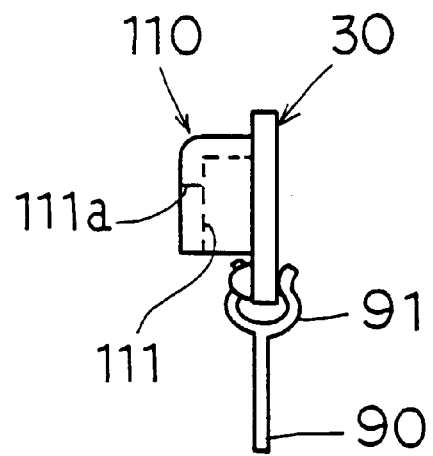
FIG. 17 is a side view illustrating the important part of the modification to the second embodiment.

FIGS. 16 and 17 illustrate a modification to the second embodiment.

In this modification, instead of the sleeve 100 described above, a sleeve 110 is bonded on the surface of the ceramic substrate 30 as a constructional characteristic.

The sleeve 110 has an opening part 111 corresponding to the opening part 71 of the sleeve 70 of the first embodiment. This opening part 111 extends to a rectangular notch 111a made in the middle part of a wall 112 located in opposition to the ceramic substrate 30.

In this construction, in the dipping and curing process S7, when the sleeve 110 is immersed in the silicon gel within the dipping tub P (FIGS. 10 and 11) in the same way as the sleeve 100, the transfer of the silicon gel into the sleeve 110 begins from the notch 111a.

Therefore, the pouring of the silicon gel into the sleeve 110 begins earlier than the case of the sleeve 100. As a result, the waiting time required for filling the inside of the sleeve 110 with the silicon gel can further be shortened.

Here, the horizontal width of the notch 111a at the dipping and curing process S7 should preferably be narrow enough to prevent the outflow of the silicon gel transferred into the sleeve 110 from the notch 111a before curing due to the surface tension.

Figure 18:
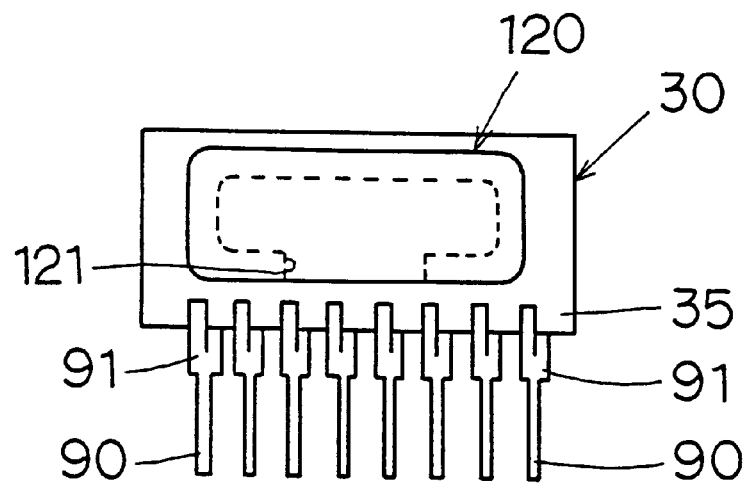
FIG. 18 is a plan view illustrating an important part of a third embodiment according to the present invention.
Figure 19:
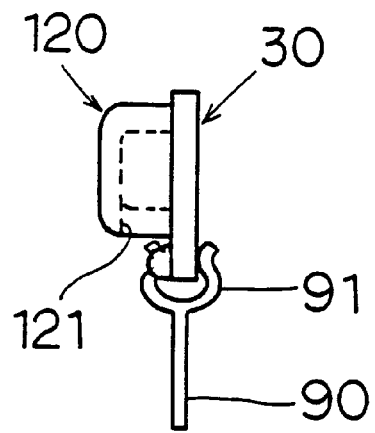
FIG. 19 is a side view illustrating the important part of the third embodiment.

FIGS. 18 and 19 illustrate a third embodiment according to the present invention.

In the third embodiment, instead of the sleeve 70 of the first embodiment, a sleeve 120 is bonded on the surface of the ceramic substrate 30 as a constructional characteristic.

Different from the opening part 71 of the sleeve 70, the sleeve 120 has a narrow opening part 121 opened to the center side in the width direction of the end part 35 of the ceramic substrate 30.

According to the third embodiment, the opening part 121 of the sleeve 120 is narrower than the opening part 71 of the sleeve 70. Therefore, the contact area of the silicon gel filling the inside of the sleeve 120 to fixingly seal the respective circuit elements within the sleeve 120 and epoxy resin filling the inside of the casing 10 is smaller compared with the first embodiment.

As a result, the protection of the respective circuit elements within the sleeve 120 from the epoxy resin within the casing 10 can be reinforced. The other construction, mode of operation and effect are the same as those of the first embodiment.

Figure 20:
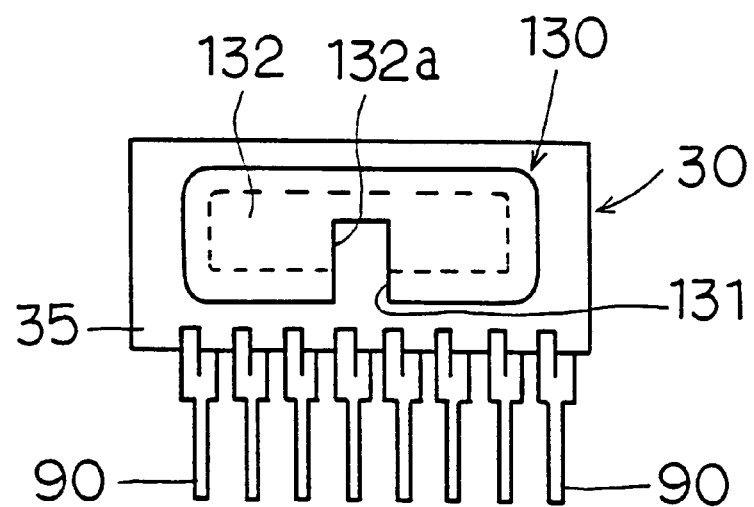
FIG. 20 is a plan view illustrating an important part of a modification to the third embodiment.
Figure 21:
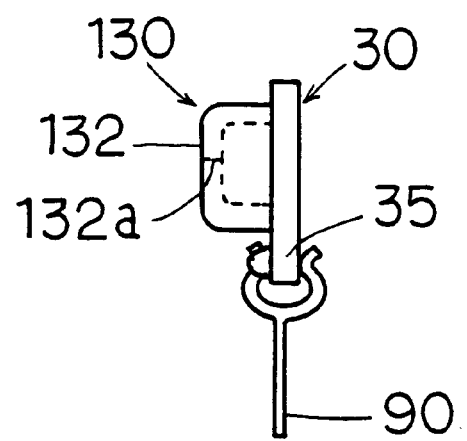
FIG. 21 is a side view illustrating the important part of the modification to the third embodiment.

FIGS. 20 and 21 illustrates a modification to the third embodiment.

In this modification, instead of the sleeve 120 described above, a sleeve 130 is bonded on the surface of the ceramic substrate 30 as a constructional characteristic.

The sleeve 130 has an opening part 131 which is narrower than the opening part 121 of the sleeve 120. This opening part 131 opens to the center side in the width direction of the end part 35 of the ceramic substrate 30 and also extends up to a rectangular notch 132a made in a wall 132 of the sleeve 130 located in opposition to the ceramic substrate 30.

In this construction, in the dipping and curing process S7, when the sleeve 130 is immersed in the silicon gel within the dipping tub P (FIGS. 10 and 11) in the same way as the sleeve 120, the transfer of the silicon gel into the sleeve 130 begins from the notch 132a.

Therefore, the transfer of the silicon gel into the sleeve 130 begins earlier than the case of the sleeve 120. As a result, the waiting time required for filling the inside of the sleeve 130 with the silicon gel can further be shortened while obtaining the mode of operation and effect of the third embodiment.

Here, the horizontal width of the notch 132a at the dipping and curing process S7 should preferably be narrow enough to prevent the outflow of the silicon gel transferred into the sleeve 130 from the notch 132a before curing due to the surface tension.

Figure 22:
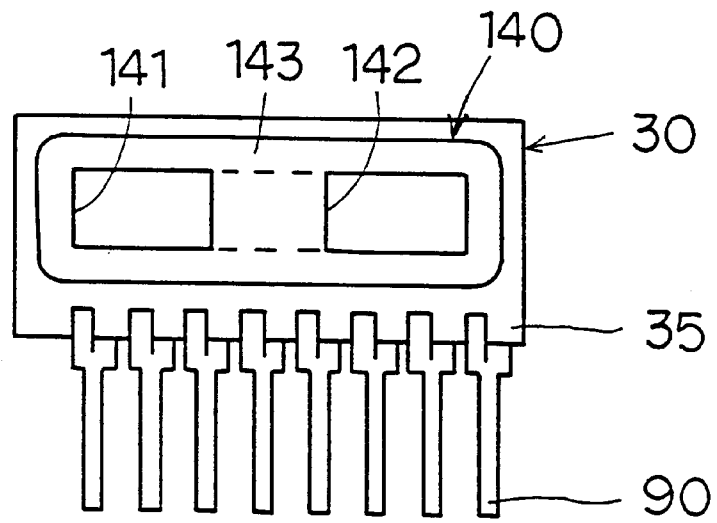
FIG. 22 is a plan view illustrating an important part of the fourth embodiment according to the present invention.
Figure 23:
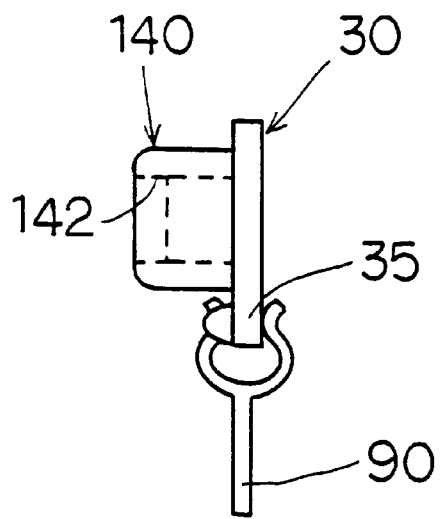
FIG. 23 is a side view illustrating the important part of the fourth embodiment.

FIGS. 22 and 23 illustrates a fourth embodiment according to the present invention.

In the fourth embodiment, instead of the sleeve 70 of the first embodiment, a sleeve 140 is bonded on the surface of the ceramic substrate 30 as a constructional characteristic.

The sleeve 140 has a pair of opening parts 141 and 142. These opening parts 141 and 142 are made in a wall 143 of the sleeve 140 located in opposition to the ceramic substrate 30. The opening part 141 is located in opposition to the semiconductor chip 40, both the bonding wires 40a and 40b and both the bonding pads 31 and 32 which are described in the description of the first embodiment, and the opening part 142 is located in opposition to the semiconductor chip 50, both the bonding wires 50a and 50b and both the bonding pads 33 and 34, which are described in the first embodiment. The other construction is the same as that of the first embodiment.

In the fourth embodiment constructed as described above, in the dipping and curing process S7, the ceramic substrate 30 is inclinedly held with both the opening parts 141 and 142 of the sleeve 140 inclinedly and upwardly opened, and then, while keeping this posture, lowered into the silicon gel within the dipping tub P. By this immersion, the silicon gel is transferred into the sleeve 140.

In this case, as the opening areas of both the opening parts 141 and 142 of the sleeve 140 are smaller than the surface area of the above wall 143 of the sleeve 140, although the ceramic substrate 30 is in the inclined position, the transfer of the silicon gel into the sleeve 140 can properly be achieved.

Furthermore, because of the inclined position, the terminals 90 of the clip 90A is always positioned above the silicon gel within the dipping tub P, and thus the silicon gel will not adhere to any of the terminals 90 of the clip 90A.

Accordingly, as the manufacture of the semiconductor package can be performed with the ceramic substrate 30 in the inclined position as described above, even the semiconductor package is of the sleeve construction according to the fourth embodiment, the automation of the manufacture of the semiconductor package is possible, and the semiconductor package suitable to automatic manufacture can be provided.

Furthermore, as described above, as the opening part 141 is located in opposition to the semiconductor chip 40, both the bonding wires 40a and 40b and both the bonding pads 31 and 32, and the opening part 142 is located in opposition to the semiconductor chip 50, both the bonding wires 50a and 50b and both the bonding pads 33 and 34, visual inspection of each circuit element can easily be performed through the opening parts 141 and 142 respectively.

The number of both the opening parts 141 and 142 may be changed. The nearer the position of both the opening parts 141 and 142 in relation to the above wall 143 is to the side of the terminal 90, the easier the automatic pouring of the silicon gel into the sleeve 140 is. The pouring of the silicon gel into the sleeve 140 according to the fourth embodiment can also be performed by hand with a dispenser by horizontally holding the sleeve 140. In this case, it is preferable that the silicon gel should thermally be cured once after the pouring as a pre-pouring and then the silicon substrate 30 should be dipped into the silicon gel again as a main pour. At this time, it is possible to vertically lower the silicon substrate 30 as illustrated in FIGS. 10 and 11.

Figure 24:
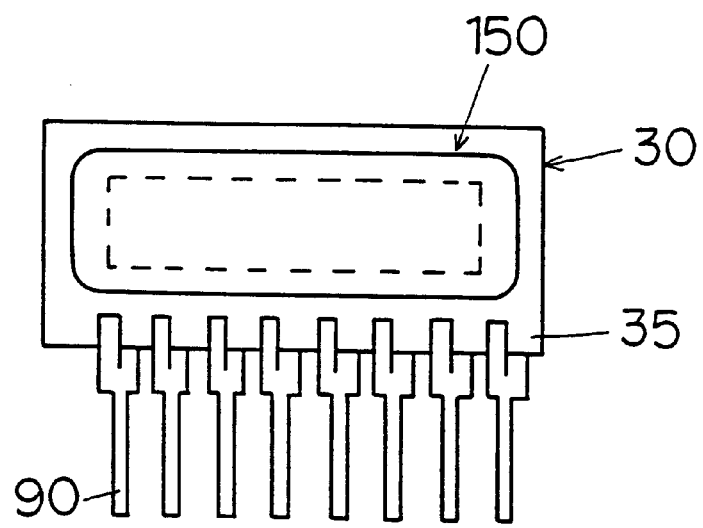
FIG. 24 is a plan view illustrating an important part of the fifth embodiment according to the present invention.
Figure 25:
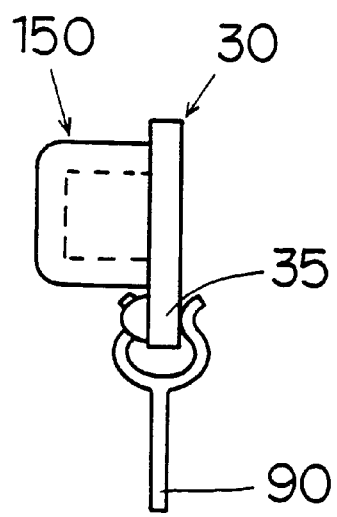
FIG. 25 is a side view illustrating the important part of the fifth embodiment.
Figure 26:
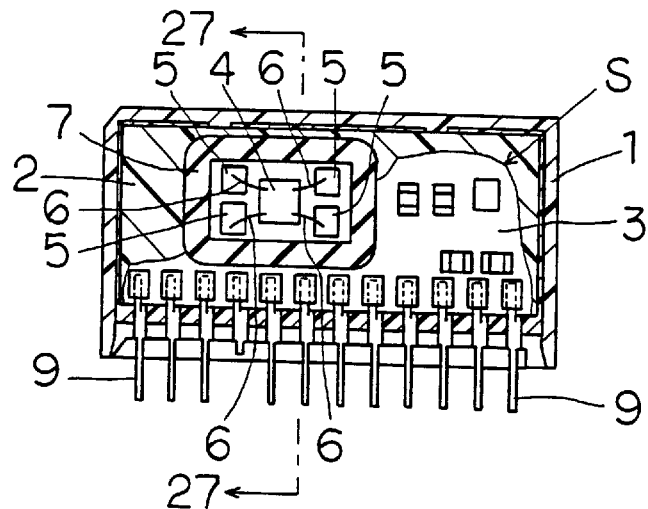
FIG. 26 is a sectional view taken along line 26—26 of FIG. 27 and shows a front view of a conventional semiconductor package.
Figure 27:
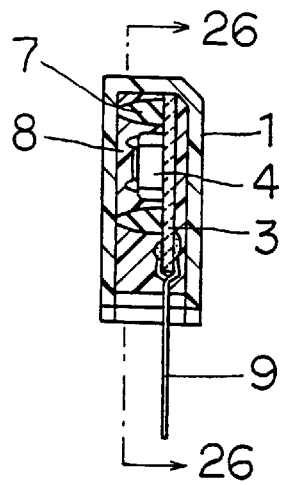
FIG. 27 is a sectional view taken along line 27—27 of FIG. 26 and shows a side view of the conventional semiconductor package.
Figure 28:
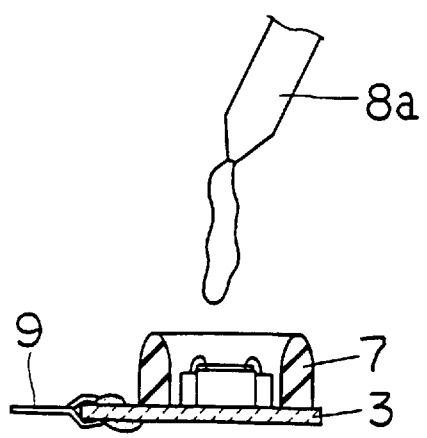
FIG. 28 is a view illustrating a state in which silicon gel is poured into the sleeve of the conventional semiconductor package.

FIGS. 24 and 25 illustrate a fifth embodiment according to the present invention.

In the fifth embodiment, instead of the sleeve 70 described in the first embodiment, a sleeve 150 is bonded on the surface of the ceramic substrate 30 and the use of the silicon gel 80 is abolished.

The sleeve 150 is box shaped. This sleeve 150 covers overall the respective semiconductor chips 40 and 50, the MIC 60, the respective bonding wires 40a, 40b, 50a and 50b and the respective bonding pads 31 through 34 on the surface of the ceramic substrate 30.

Therefore, each circuit element within the sleeve 150 can fixedly be sealed only with the sleeve 150 without using the silicon gel.

Furthermore, as the use of the silicon gel 80 is abolished, the process for pouring silicon gel into the sleeve as described in the description of the first embodiment can also be abolished. As a result, the automatic manufacture of the semiconductor package is possible, and the saving of construction materials is also possible.

In the above description of the respective embodiments and modifications thereto, examples which employ silicon rubber as a sleeve forming material are described. However, the sleeve forming material should not be limited to the silicon rubber but any other material which is an electrically insulating material having an ability to cut off the transmission of the thermal stress of the epoxy resin to the silicon gel, such as an elastic resin insulating material, may be used instead.

Furthermore, in embodying the present invention, instead of the epoxy resin described in the description of the respective embodiments and modifications thereto, various resins and silicon rubbers which have properties same as or similar to the epoxy resin may be used.

Still furthermore, in embodying the present invention, the type of the semiconductor package should not be limited to SIP but various types of the semiconductor package, such as dual in-like package (DIP), which require the fixed sealing of the circuit elements including the semiconductor chips and the bonding wires mounted on the ceramic substrate may be used.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A component member for a semiconductor package which comprises a circuit substrate which is housed within a casing and sealed in an insulating material filled in said casing and a circuit element mounted on said circuit substrate, said component member comprising:

a cover member provided on said circuit substrate and having a configuration for covering at least a portion of and surrounding at least a portion of said mounted circuit element, said cover member having an opening defined therethrough; and a sealing material filled in said cover member through said opening part to seal said circuit element, wherein said cover member with openings defines a pocket for receiving said sealing material whereby said sealing material can substantially fill said pocket even if said circuit substrate is inclined to horizontal.

2. A component member according to claim 1, wherein said opening part of said cover member is disposed to orientate to an opening of said casing.

3. A component member according to claim 2, wherein said cover member is a pocket-shaped cover member provided with said opening part opened in a direction along said circuit substrate.

4. A component member according to claim 1, wherein said cover member is made of an elastic insulating material.

5. A component member according to claim 4, wherein said elastic insulating material is silicon rubber.

6. A component member according to claim 2, wherein said cover member is made of an elastic insulating material.

7. A component member according to claim 6, wherein said elastic insulating material is silicon rubber.

8. A component member according to claim 3, wherein said cover member is made of an elastic insulating material.

9. A component member according to claim 8, wherein said elastic insulating material is silicon rubber.

10. A semiconductor package comprising:

a circuit substrate;

a circuit element mounted on said circuit substrate;

a casing housing said circuit substrate and said circuit element;

a cover member mounted on said circuit substrate to cover said circuit element and provided with an opening part opened in a direction along said circuit substrate;

a first filling material composed of an insulating resin, said first filling material being filled in an interior formed by said cover member and said circuit substrate to seal said circuit element; and a second filling material composed of an insulating resin, said second filling material being filled in said casing to seal said circuit substrate and said cover member.

11. A semiconductor package according to claim 10, wherein said first filling material is silicon gel and said second filling material is epoxy resin.

12. A semiconductor package according to claim 10, wherein said cover member is a pocket-shaped cover member provided with said opening part orientating to an entrance of said casing.

13. A semiconductor package according to claim 12, wherein said opening part of said cover member has an opening width narrower than a width of said cover member.

14. A semiconductor package according to claim 12, wherein said opening part is continuously provided on a wall located in opposition to said circuit substrate.

15. A semiconductor package comprising:

a circuit substrate;

a circuit element mounted on said circuit substrate;

a casing for housing said circuit substrate and said circuit element;

a box-shaped cover member mounted on said circuit substrate to cover at least a portion of said circuit element and provided with an opening part opened at a part of a wall located in opposition to said circuit substrate;

a first filling material composed of an insulating resin, said first filling material being filled in an interior formed by said cover member and said circuit substrate to seal said circuit element; and a second filling material composed of an insulating resin, said second filling material being filled in said casing to seal said circuit substrate and said cover member.

16. A semiconductor package according to claim 10, wherein said cover member is made of an elastic insulating material.

17. A semiconductor package according to claim 16, wherein said elastic insulating material is silicon rubber.

18. A semiconductor package according to claim 11, wherein said cover member is made of an elastic insulating material.

19. A semiconductor package according to claim 18, wherein said elastic insulating material is silicon rubber.

20. A semiconductor package according to claim 12, wherein said cover member is made of an elastic insulating material.

21. A semiconductor package according to claim 20, wherein said elastic insulating material is silicon rubber.

22. A semiconductor package according to claim 13, wherein said cover member is made of an elastic insulating material.

23. A semiconductor package according to claim 22, wherein said elastic insulating material is silicon rubber.

24. A semiconductor package according to claim 14, wherein said cover member is made of an elastic insulating material.

25. A semiconductor package according to claim 24, wherein said elastic insulating material is silicon rubber.

26. A semiconductor package according to claim 15, wherein said cover member is made of an elastic insulating material.

27. A semiconductor package according to claim 26, wherein said elastic insulating material is silicon rubber.

28. A component member for a semiconductor package according to claim 1, wherein said sealing material is silicon gel and said insulating resin is epoxy resin.

29. A component member for a semiconductor package according to claim 3, wherein said opening part continuously extends to a part of a wall of said pocket-shaped cover member in opposition to said circuit substrate.

30. A semiconductor package according to claim 15, wherein said first filling material is silicon gel and said second filling material is epoxy resin.

* * * * *